US009482713B2

United States Patent
Kim et al.

(10) Patent No.: US 9,482,713 B2
(45) Date of Patent: Nov. 1, 2016

(54) METHOD AND SYSTEM OF DIAGNOSING BREAKDOWN DURING PRE-CHARGING

(71) Applicant: Hyundai Motor Company, Seoul (KR)

(72) Inventors: Mi Ok Kim, Gyeonggi-Do (KR); Jong Hu Yoon, Jeollanam-do (KR); Hyun Soo Park, Gyeonggi-Do (KR); Myeong S. Choi, Gyeonggi-Do (KR); Beom Gyu Kim, Gyeonggi-Do (KR)

(73) Assignee: Hyundai Motor Company, Seoul (KR)

( * ) Notice: Subject to any disclaimer, the term of this patent is extended or adjusted under 35 U.S.C. 154(b) by 147 days.

(21) Appl. No.: 14/480,946

(22) Filed: Sep. 9, 2014

(65) Prior Publication Data

US 2015/0185271 A1    Jul. 2, 2015

(30) Foreign Application Priority Data

Dec. 30, 2013  (KR) .......................... 10-2013-0167272

(51) Int. Cl.
*H01H 31/12*   (2006.01)
*G01R 31/02*   (2006.01)
*H02J 7/00*   (2006.01)
*G01R 31/42*   (2006.01)

(52) U.S. Cl.
CPC ............. *G01R 31/028* (2013.01); *G01R 31/42* (2013.01); *H02J 7/00* (2013.01)

(58) Field of Classification Search
CPC .. G01R 31/02; G01R 31/25; G01R 31/3606; G01R 31/3644; B60L 11/1803; B60L 11/1816; B60L 11/1859; B60L 11/1861; B60L 11/1864; H02J 7/00; H02J 7/0016; H02J 7/345
See application file for complete search history.

(56) References Cited

U.S. PATENT DOCUMENTS

| | | | |
|---|---|---|---|
| 2008/0185999 A1* | 8/2008 | Matsukawa | H02J 7/0077 320/166 |
| 2011/0316489 A1* | 12/2011 | Norimatsu | H02M 1/36 320/166 |
| 2014/0203735 A1* | 7/2014 | Sugiyama | H02J 1/00 318/139 |
| 2015/0204946 A1* | 7/2015 | Kinoshita | H01H 47/002 324/421 |

FOREIGN PATENT DOCUMENTS

| | | |
|---|---|---|
| KR | 10-2005-0023138 A | 3/2005 |
| KR | 10-2007-0047384 | 5/2007 |
| KR | 10-0837968 B1 | 6/2008 |
| KR | 10-2011-0096202 | 8/2011 |
| KR | 10-2012-0073520 | 7/2012 |
| KR | 10-2013-0126146 A | 11/2013 |

* cited by examiner

*Primary Examiner* — Minh N Tang
(74) *Attorney, Agent, or Firm* — Mintz Levin Cohn Ferris Glovsky and Popeo, P.C.; Peter F. Corless

(57) ABSTRACT

A method and system of diagnosing a breakdown during pre-charging are provided. The method includes detecting, by a controller, an output voltage of a battery and pre-charging a capacitor of an inverter using energy from the battery. In addition, the controller is configured to measure a voltage applied to the capacitor of the inverter and detect an output current of the battery. A breakdown may then be detected by the controller by collating the detected output voltage, the voltage applied to the capacitor, and the detected output current.

20 Claims, 3 Drawing Sheets

METHOD AND SYSTEM OF DIAGNOSING BREAKDOWN DURING PRE-CHARGING

CROSS-REFERENCE(S) TO RELATED APPLICATION

The present application claims priority of Korean Patent Application Number 10-2013-0167272 filed on Dec. 30, 2013, the entire contents of which application is incorporated herein for all purposes by this reference.

BACKGROUND

1. Field of the Invention

The present invention relates to a method and system of diagnosing a breakdown of a component during a pre-charging operation, and more particularly to a method and system of diagnosing a breakdown of a component during a pre-charging operation, which diagnose a breakdown of a component from a voltage and a current of a battery detected during the pre-charging operation and a voltage applied to a capacitor of an inverter during the pre-charging operation.

2. Description of the Related Art

Hybrid vehicles and electric vehicles are vehicles which obtain force (e.g., driving power) for driving wheels by rotating a motor with use of electricity from a high voltage battery. A Power Relay Assembly (PRA) includes a main relay and a pre-charging circuit. The main relay is switched on and off to allow current to be applied to an inverter from a high voltage battery, thereby rotating a motor. A pre-charging circuit causes the capacitor of the inverter to be pre-charged before the high voltage battery and the capacitor of the inverter are connected via the main relay. This pre-charging operation prevents arc discharge which may occur when the high voltage battery and the capacitor of the inverter are directly connected to each other without an intervening main relay, thereby securing stability of a circuit.

During the pre-charging operation, an output voltage of the high voltage battery and a voltage of the capacitor of the inverter are compared with each other, a predetermined time, for example, about 20 ms after starting of the pre-charging operation. When the voltage applied to the capacitor of the inverter is about 80% of the output voltage of the high voltage battery or greater, it is determined to be normal (e.g., no failure), but it is, otherwise, determined to be abnormal, i.e., determined that a breakdown of a component has occurred.

In response to determining an abnormal condition during the pre-charging operation, the PRA is replaced, a battery management system (BMS) which operates the high voltage battery is replaced, and other component are checked to see when they are normal or broken down (e.g., failure has occurred). In other words, all components sequentially undergo an inspection process. On the other hand, when a component is out of order while the pre-charging operation is performed, a pre-charging a resistor may be burned, and operation of preventing an engine from being started is performed.

The foregoing is intended merely to aid in the understanding of the background of the present invention, and is not intended to mean that the present invention falls within the purview of the related art that is already known to those skilled in the art.

SUMMARY

Accordingly, the present invention provides a method of diagnosing a breakdown of a component of a vehicle during a pre-charging operation by monitoring in real time a voltage and a current of a high voltage battery and a voltage of a capacitor of an inverter during the pre-charging operation.

According to one aspect, a method of diagnosing a breakdown during pre-charging may include: detecting an output voltage of a high voltage battery; pre-charging a capacitor of an inverter using energy from the high voltage battery after the detection; measuring a voltage applied to the capacitor of the inverter through the pre-charging; detecting an output current of the high voltage battery after the measurement; and diagnosing a breakdown by collating the output voltage detected, the voltage applied to the capacitor, and the output current detected.

When the output voltage is not detected during the detection of the output voltage, and when the measured voltage applied to the capacitor during the pre-charging, and the detected output current of the high voltage battery are within normal ranges (e.g., predetermined ranges of when failure does not occur), a diagnosis that a circuit which detects the output voltage of the high voltage battery is broken down may be determined. When the circuit which detects the output voltage of the high voltage battery is diagnosed as being broken down, the method of diagnosing may further include starting a motor after the pre-charging, and limiting driving force of the motor.

When the voltage is not measured during the pre-charging, and when the detected output current is within a predetermined normal waveform range, a diagnosis that the inverter is broken down may be determined. When the inverter is diagnosed to be broken down, the method of diagnosing may further include starting the motor after the pre-charging, and outputting the diagnosis that the inverter is broken down.

When the voltage is not measured in during the pre-charging, and when the detected output current is a substantially constant current, a diagnosis that the motor is unable to be started may be determined. When the motor is unable to be started, the method of diagnosing may further include stopping the pre-charging. In addition, when the voltage is not measured during the pre-charging, and when the output voltage is not detected, a diagnosis that a power relay assembly which controls connection between the high voltage battery and the inverter is broken down may be determined.

The method of diagnosing during pre-charging according to one exemplary embodiment of the present invention has advantages of allowing appropriate driving of a vehicle rather than totally disabling driving of the vehicle by preventing starting of an engine, and of warning a driver to inspect a component which is suspected to be broken down, when an error occurs during the pre-charging and when the error is not fatal to the extent that driving of the vehicle is impossible. The method of diagnosing according to one exemplary embodiment of the present invention may diagnose which component is broken down (e.g., has failed) during the pre-charging in an electric or hybrid vehicle, determining which component is suspected of being broken down for inspection, thereby reducing labor and cost for inspection and repair. Further, the method of diagnosing according to one exemplary embodiment of the present invention may prevent a pre-charging resistor to be burned.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION

Figure 1:
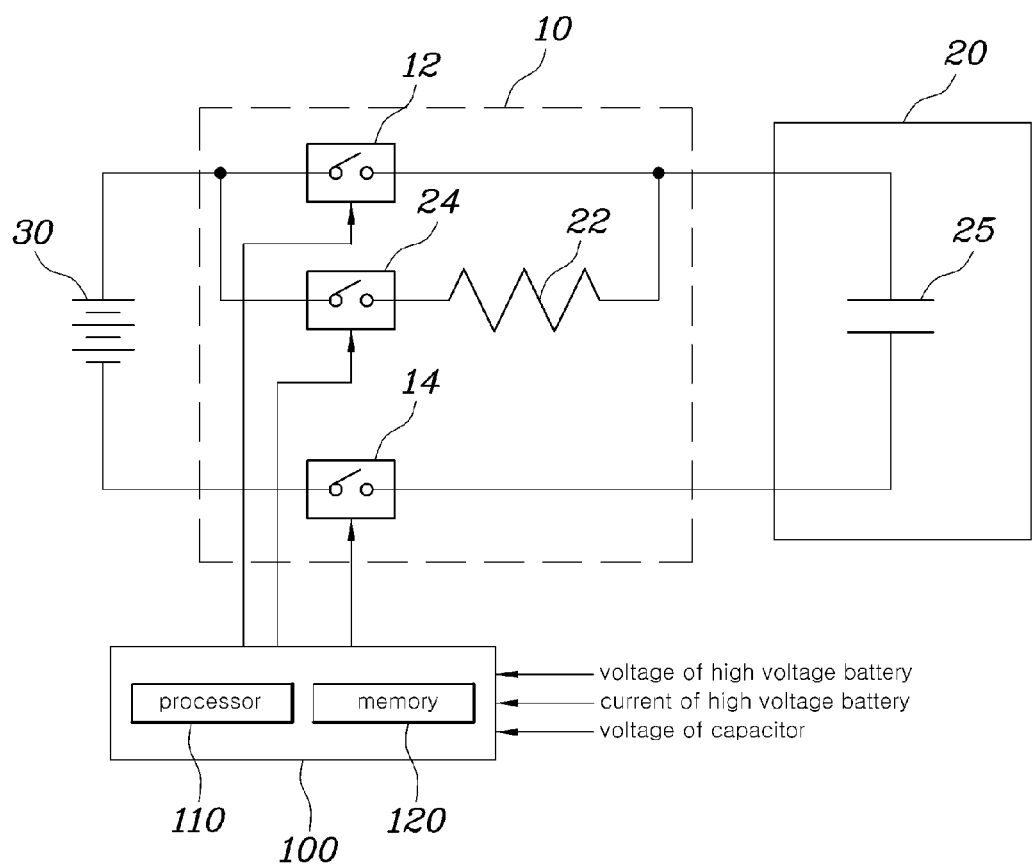
FIG. 1 is an exemplary circuitry diagram illustrating a high voltage battery, loads, and a PRA for controlling connection between the high voltage battery and the loads which are used in a hybrid or electric vehicle according to an exemplary embodiment of the present invention.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Specific structural and functional descriptions of exemplary embodiments of the present invention disclosed herein are only for illustrative purposes of the exemplary embodiments of the present invention. The present invention may be embodied in many different forms without departing from the spirit and significant characteristics of the present invention. Therefore, the exemplary embodiments of the present invention are disclosed only for illustrative purposes and should not be construed as limiting the present invention.

Reference will now be made in detail to various exemplary embodiments of the present invention, specific examples of which are illustrated in the accompanying drawings and described below, since the exemplary embodiments of the present invention can be variously modified in many different forms. While the present invention will be described in conjunction with exemplary embodiments thereof, it is to be understood that the present description is not intended to limit the present invention to those exemplary embodiments. On the contrary, the present invention is intended to cover not only the exemplary embodiments, but also various alternatives, modifications, equivalents and other exemplary embodiments that may be included within the spirit and scope of the present invention as defined by the appended claims.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between," "directly between," "adjacent to," or "directly adjacent to," should be construed in the same way.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, exemplary embodiments of the present invention will be described with reference to the accompanying drawings. Throughout the drawings, the same reference numerals will refer to the same or like parts.

Figure 2:
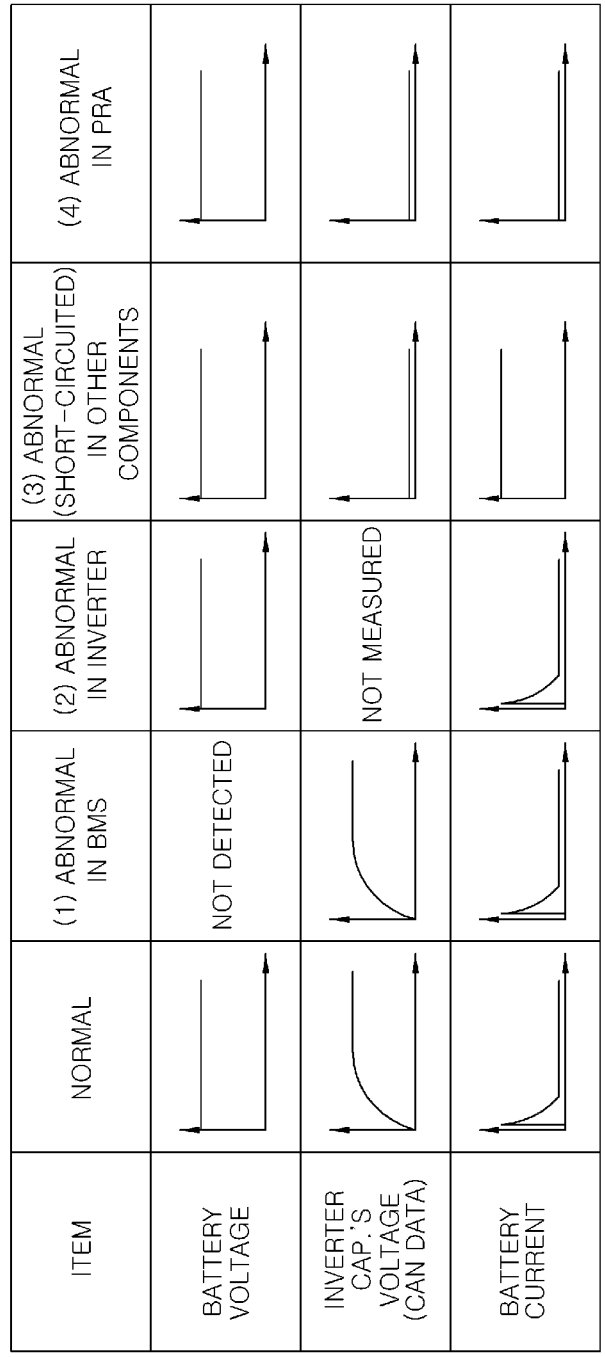
FIG. 2 is an exemplary table showing behaviors of an output voltage and an output current of the high voltage battery and a voltage applied to a capacitor of an inverter wherein the output voltage and output current of the high voltage battery and the voltage applied to the capacitor are measured or detected to diagnose a breakdown according to an exemplary embodiment of the present invention.

FIG. 1 is an exemplary circuitry diagram illustrating a high voltage battery 30, loads 20, and a PRA 10 configured to connect the high voltage battery 10 and the loads 20 used in a hybrid or electric vehicle and FIG. 2 is an exemplary table showing behaviors of an output voltage and an output current of the high voltage battery and a voltage applied to a capacitor of an inverter wherein the output voltage and the output current of the high voltage battery and the voltage applied to the capacitor are measured or detected to diagnose a breakdown of a component in a vehicle.

With reference to FIG. 1, the power relay assembly 10 may include a first main relay 12, a second main relay 14, a pre-charging resistor 22, and a pre-charging relay 24. The first main relay 12 may be connected in series to a positive terminal of the high voltage battery 30 and may be configured to intercept over current supplied from the high voltage battery 30. Additionally, the pre-charging relay 24 may be connected in parallel to the first main relay 12, and the pre-charging resistor 22 may be connected in series to the pre-charging relay 24. Further, the second main relay 14 may be connected to a negative terminal of the high voltage battery 30.

The loads 20 may include a motor connected to an inverter. The direct current supplied from the high voltage battery 30 may be converted into alternating current by a switching operation of the inverter, and the alternating current may be supplied to the motor. In particular, the first main relay 12 may be turned on and the pre-charging relay 24 may be turned off while a vehicle is running to apply the power from the high voltage battery 30 to the loads 20 such as the inverter. While a vehicle is not running, the connection between the high voltage battery 30 and the loads 20 such as the inverter may be cut off to prevent the power from the high voltage battery 30 to be transferred to the motor.

Furthermore, when the driving of the vehicle is resumed, the pre-charging relay 24 may first be turned on. Then, the voltage of the high voltage battery 30 dropped by the pre-charging resistor 22 may be applied to the loads 20 such as the inverter, to charge a capacitor 25. When the charging of the capacitor 25 sufficiently progresses, the first main relay 12 may be turned on and the pre-charging relay 24 may be turned off simultaneously as the turning-on of the first relay 12 to apply the voltage of the high voltage battery 30 to the loads 20 such as the inverter. Intensive power may not be abruptly applied to the first and second main relays 12 and 14 due to the presence of the pre-charging relay 23 and the pre-charging resistor 22, to prevent damage or short-circuit of electrodes of the first and second relays 12 and 14.

With reference to FIG. 2, the particular component that has failed may be determined from the output voltage and current of the high voltage battery 30 and the voltage applied to the capacitor of the inverter. For example, when a breakdown of any component is not detected during pre-charging, the output voltage of the high voltage battery may remain constant and the output current may be initially high (e.g., increased) but may decrease abruptly to a substantially low value (e.g., a significantly lower value) after the voltage applied to the capacitor rises and thus reaches a predetermined level. These behaviors of the output voltage and current of the high voltage battery and the voltage applied to the capacitor of the inverter may be set as normal behaviors, and compared with an output voltage, an output current, and an application voltage measured thereafter to diagnose a breakdown of a component of a vehicle.

Figure 3:
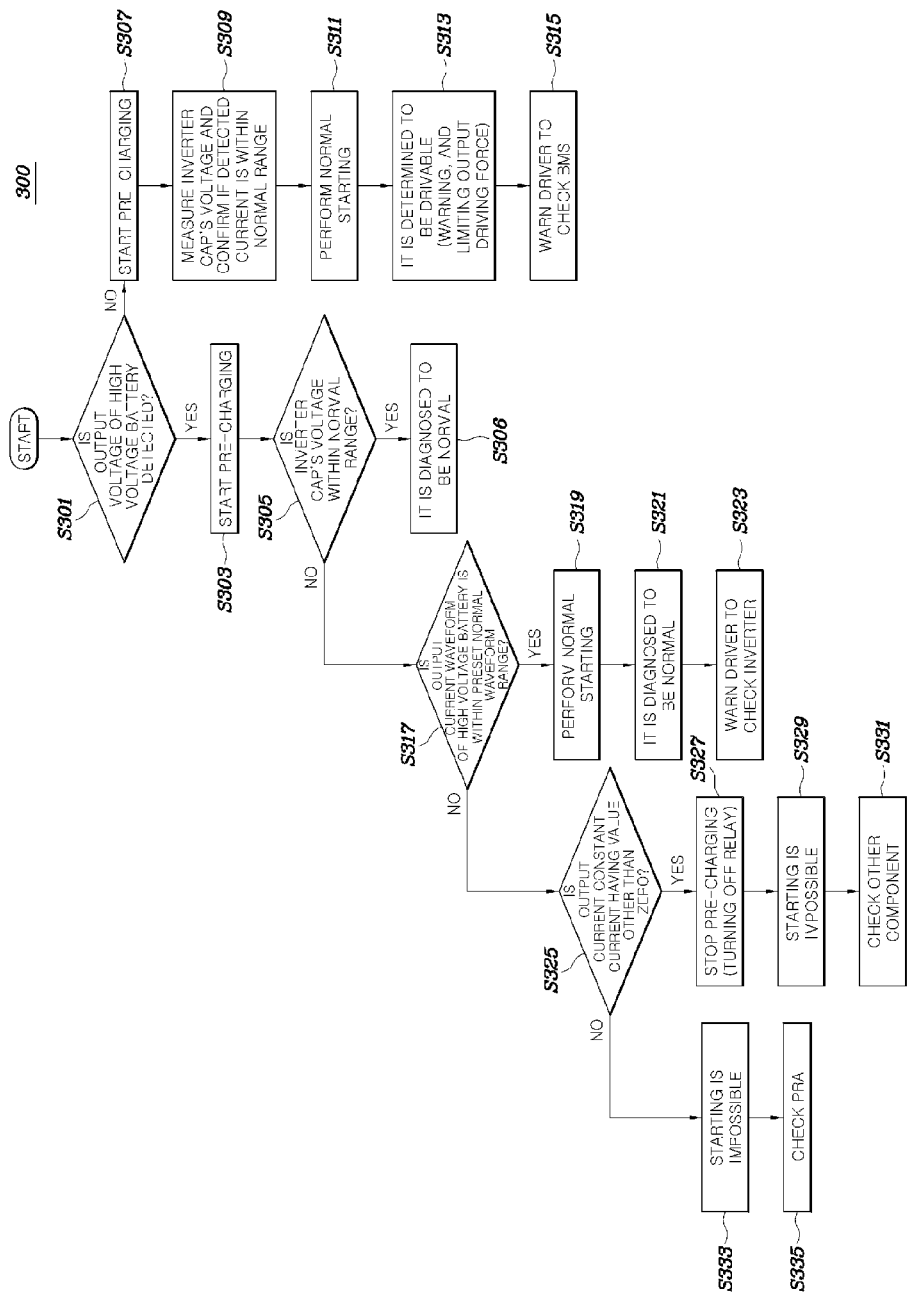
FIG. 3 is an exemplary flowchart showing a method of diagnosing a breakdown during pre-charging according to an exemplary embodiment of the present invention.

A method of diagnosing a breakdown of a component according to one exemplary embodiment of the present invention will be described with reference to FIG. 3. The diagnosis method may be executed by a controller 100 having a processor 110 and a memory 120. That is, the controller may be configured to execute each step of the diagnosis method as shown in FIG. 3. In particular, FIG. 3 is an exemplary flowchart showing the method of diagnosing a breakdown of a component during pre-charging according to one exemplary embodiment of the present invention. The method may include detecting an output voltage of a high voltage battery 30 (S301), pre-charging a capacitor 25 of an inverter using energy from the high voltage battery 30 (S303 or S307), measuring a voltage applied to a capacitor 25 of an inverter during the pre-charging (S305 or S309), detecting an output current of the high voltage battery 30 (S317 or S309), and diagnosing a breakdown of a component by collating the detected output voltage, the measured voltage applied to the capacitor, and the detected output current (S315, S306, S323, S331, or S335).

When the output voltage of the high voltage battery 30 is detected in S301 and when the measured voltage applied to the capacitor 25 during the pre-charging (S307) and the detected output current of the high voltage battery 30 are within normal ranges (e.g., predetermined ranges wherein failure is not detected) in S309, a first main relay 12 may be connected normally to start a motor of a vehicle via the inverter in S311 to allow the vehicle to be driven in S313. In particular, even though the vehicle may be driven, a circuit which detects the output voltage of the high voltage battery may be detected to be broken down when the output voltage of the high voltage battery 30 is not detected. Accordingly, a warning message may be output to a driver to cause the driver to limit the driving force of the motor in S313 or may check the circuit which detects the output voltage of the high voltage battery 30 in S315.

When the voltage applied to the capacitor of the inverter during the pre-charging (S303) is measured in S305 and the measured voltage is within a preset normal range, a diagnosis may be determined that a breakdown has not occurred during the pre-charging in S306. On the other hand, when the voltage applied to the capacitor of the inverter is not measured in S305 and when the detected output current of the high voltage battery 30 is within the preset normal waveform range in S317, a failure of the inverter may be determined In particular, the motor may be started in S319 to allow the vehicle to be driven (S321). However, since the voltage applied to the capacitor of the inverter may not be measured, it a failure or break down of the inverter may be determined or an error of data of the voltage applied to the capacitor of the inverter may be determined, and a driver may be notified to check the inverter in S315.

When the voltage applied to the capacitor of the inverter is not measured in S305, whether the detected output current of the high voltage battery 30 is a constant current having a value other than 0 in S325 may be determined. When the detected output current of the high voltage battery 30 is a constant current having a value other than 0, the pre-charging relay 24 may be turned off to stop the pre-charging in S327, and an engine may be determined to be unable to start in S329. This case may include an event that a wire in a vehicle system is short-circuited or an event that any of other power electric components is broken down. Accordingly, the circuit configured to detect the output voltage of the high voltage battery 30, the inverter, and the PRA may not undergo inspection, but the other power electric components may undergo inspection in S331. When the detected output current of the high voltage battery 30 is about 0, the PRA 10 configured to connect the high voltage battery 30 and the inverter may be determined to have experienced a failure or be broken down. In particular, the engine may be started. Accordingly, starting of an engine may be prevented in S333, and the PRA may be inspected in S335.

Although exemplary embodiments of the present invention has been described for illustrative purposes, those skilled in the art will appreciate that various modifications, additions and substitutions are possible, without departing from the scope and spirit of the invention as disclosed in the accompanying claims.

What is claimed is:

1. A method of diagnosing a breakdown during pre-charging, comprising:
    detecting, by a controller, an output voltage of a battery;
    pre-charging, by the controller, a capacitor of an inverter using energy from the battery;
    measuring, by the controller, a voltage applied to the capacitor of the inverter through the pre-charging;
    detecting, by the controller, an output current of the battery after the voltage is measured; and
    diagnosing, by the controller, a breakdown of a component by collating the detected output voltage, the voltage applied to the capacitor, and the detected output current.

2. The method according to claim 1, further comprising:
    detecting, by the controller, that a circuit configured to detect the output voltage of the battery is broken down when the output voltage is not detected, and when the measured voltage applied to the capacitor through the pre-charging, and the detected output current of the battery are within normal ranges.

3. The method according to claim 2, further comprising:
    starting, by the controller, a motor after the pre-charging, and
    limiting, by the controller, a driving force of the motor, when the circuit configured to detect the output voltage of the battery is detected to be broken down.

4. The method according to claim 1, further comprising:
    detecting, by the controller, that the inverter is broken down when the voltage is not measured and when the output current detected is within a predetermined normal waveform range.

5. The method according to claim 4, further comprising:
    starting, by the controller, a motor after the pre-charging, and
    outputting, by the controller, the detection that the inverter is broken down, when the inverter is detected to be broken down.

6. The method according to claim 1, further comprising:
    determining, by the controller, that a motor is unable to be started when the voltage is not measured and when the detected output current is a substantially constant current.

7. The method according to claim 6, further comprising:
    stopping, by the controller, the pre-charging, when the motor is unable to be started.

8. The method according to claim 1, further comprising:
    detecting, by the controller, that a power relay assembly configured to connect the battery and the inverter is broken down when the voltage is not measured and when the output voltage is not detected.

9. A system of diagnosing a breakdown during pre-charging, comprising:
    a memory configured to store program instructions; and
    a processor configured to execute the program instructions, the program instructions when executed configured to:
        detect an output voltage of a battery;
        pre-charge a capacitor of an inverter using energy from the battery;
        measure a voltage applied to the capacitor of the inverter through the pre-charging;
        detect an output current of the battery after the voltage is measured; and
        diagnose a breakdown of a component by collating the detected output voltage, the voltage applied to the capacitor, and the detected output current.

10. The system of claim 9, wherein the program instructions when executed are further configured to:
    detect that a circuit configured to detect the output voltage of the battery is broken down when the output voltage is not detected, and when the measured voltage applied to the capacitor through the pre-charging, and the detected output current of the battery are within normal ranges.

11. The system of claim 10, wherein the program instructions when executed are further configured to:
    start a motor after the pre-charging, and
    limit a driving force of the motor, when the circuit configured to detect the output voltage of the battery is detected to be broken down.

12. The system of claim 9, wherein the program instructions when executed are further configured to:
    detect that the inverter is broken down when the voltage is not measured and when the output current detected is within a predetermined normal waveform range.

13. The system of claim 12, wherein the program instructions when executed are further configured to:
    start a motor after the pre-charging, and
    output the detection that the inverter is broken down, when the inverter is detected to be broken down.

14. The system of claim 9, wherein the program instructions when executed are further configured to:
    determine that a motor is unable to be started when the voltage is not measured and when the detected output current is a substantially constant current.

15. The system of claim 14, wherein the program instructions when executed are further configured to:
    stop the pre-charging, when the motor is unable to be started.

16. The system of claim 9, wherein the program instructions when executed are further configured to:
    detect that a power relay assembly configured to connect the battery and the inverter is broken down when the voltage is not measured and when the output voltage is not detected.

17. A non-transitory computer readable medium containing program instructions executed by a controller, the computer readable medium comprising:
    program instructions that detect an output voltage of a battery;
    program instructions that pre-charge a capacitor of an inverter using energy from the battery;
    program instructions that measure a voltage applied to the capacitor of the inverter through the pre-charging;
    program instructions that detect an output current of the battery after the voltage is measured; and
    program instructions that diagnose a breakdown of a component by collating the detected output voltage, the voltage applied to the capacitor, and the detected output current.

18. The non-transitory computer readable medium of claim 17, further comprising:
    program instructions that detect that a circuit configured to detect the output voltage of the battery is broken down when the output voltage is not detected, and when the measured voltage applied to the capacitor through the pre-charging, and the detected output current of the battery are within normal ranges.

19. The non-transitory computer readable medium of claim 18, further comprising:
program instructions that start a motor after the pre-charging, and
program instructions that limit a driving force of the motor, when the circuit configured to detect the output voltage of the battery is detected to be broken down.

20. The non-transitory computer readable medium of claim 17, further comprising:
program instructions that detect that the inverter is broken down when the voltage is not measured and when the output current detected is within a predetermined normal waveform range.

* * * * *